United States Patent
You et al.

(10) Patent No.: US 11,606,082 B2
(45) Date of Patent: Mar. 14, 2023

(54) ADJUSTABLE PHASE SHIFTER

(71) Applicant: International Business Machines Corporation, Armonk, NY (US)

(72) Inventors: Yang You, Austin, TX (US); Chad Andrew Marquart, Austin, TX (US); Glen A. Wiedemeier, Austin, TX (US); Tyler Bohlke, Rochester, MN (US); Daniel M. Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/325,299

(22) Filed: May 20, 2021

(65) Prior Publication Data

US 2022/0376677 A1    Nov. 24, 2022

(51) Int. Cl.
  *H03H 11/20*    (2006.01)
  *G06F 1/10*    (2006.01)
  *G06F 1/08*    (2006.01)

(52) U.S. Cl.
  CPC .............. *H03H 11/20* (2013.01); *G06F 1/08* (2013.01); *G06F 1/10* (2013.01)

(58) Field of Classification Search
  None
  See application file for complete search history.

(56) References Cited

U.S. PATENT DOCUMENTS

| | | | |
|---|---|---|---|
| 7,460,589 B2 | 12/2008 | Fujimori et al. | |
| 7,555,085 B1 | 6/2009 | Risk et al. | |
| 7,724,857 B2 | 5/2010 | Abel et al. | |
| 9,337,993 B1 | 5/2016 | Lugthart et al. | |
| 9,893,734 B1* | 2/2018 | Chillara | H03L 7/07 |
| 10,168,385 B2 | 1/2019 | Lu et al. | |
| 2006/0062341 A1 | 3/2006 | Edmondson et al. | |
| 2017/0237419 A1 | 8/2017 | Clara | |

FOREIGN PATENT DOCUMENTS

GB    2541323 A    2/2017

OTHER PUBLICATIONS

You et al., "A 25-50Gb/s 2.22pJ/b NRZ RX with Dual-Bank and 3-tap Speculative DFE for Microprocessor Application in 7nm FinFET CMOS," 978-1-7281-9942-9/20 | IEEE, 2020 (Grace Period Disclosure).

\* cited by examiner

*Primary Examiner* — Cassandra F Cox
(74) *Attorney, Agent, or Firm* — Patterson + Sheridan, LLP

(57) ABSTRACT

A method includes determining a phase error for a first clock signal and a second clock signal and determining an offset based on the phase error for the first clock signal and the second clock signal. The method also includes adding the offset to a phase of the first clock signal to produce a first adjusted clock signal and subtracting the offset from a phase of the second clock signal to produce a second adjusted clock signal. A phase error for the first adjusted clock signal and the second adjusted clock signal is smaller than the phase error for the first clock signal and the second clock signal.

19 Claims, 7 Drawing Sheets

ADJUSTABLE PHASE SHIFTER

STATEMENT REGARDING PRIOR DISCLOSURES BY THE INVENTOR OR A JOINT INVENTOR

The following disclosure(s) are submitted under 35 U.S.C. 102(b)(1)(A):
DISCLOSURE: You et al., "A 25-50 Gb/s 2.22 pJ/b NRZ RX with Dual-Bank and 3-tap Speculative DFE for Microprocessor Application in 7 nm FinFET CMOS," 978-1-7281-9942-9/20|IEEE, 2020

BACKGROUND

The present invention relates to phase shifting, and more specifically, to an adjustable phase shifter.

SUMMARY

According to an embodiment, a method includes determining a phase error for a first clock signal and a second clock signal and determining an offset based on the phase error for the first clock signal and the second clock signal. The method also includes adding the offset to a phase of the first clock signal to produce a first adjusted clock signal and subtracting the offset from a phase of the second clock signal to produce a second adjusted clock signal. A phase error for the first adjusted clock signal and the second adjusted clock signal is smaller than the phase error for the first clock signal and the second clock signal.

According to another embodiment, a phase adjustor includes first adjustor, a second adjustor, and a control line connected to the first adjustor and the second adjustor. The first adjustor produces a first adjusted clock signal by adding an offset to a phase of a first clock signal if a control signal on the control line is high and subtracting the offset from the phase of the first clock signal if the control signal is low. The second adjustor produces a second adjusted clock signal by subtracting the offset from a phase of a second clock signal if the control signal is high and adding the offset to the phase of the second clock signal if the control signal is low. The offset is determined based on a phase error for the first clock signal and the second clock signal.

According to another embodiment, a method includes determining an offset based on a phase error for a first clock signal and a second clock signal, toggling a first switch such that the offset is added to a phase of the first clock signal to produce a first adjusted clock signal, and toggling a second switch such that the offset is subtracted from a phase of the second clock signal to produce a second adjusted clock signal. A phase error for the first adjusted clock signal and the second adjusted clock signal is smaller than the phase error for the first clock signal and the second clock signal.

DETAILED DESCRIPTION

Phase adjustors may be used to adjust the phases of signals (e.g., to shift the phases of clock signals). Adjusting the phases of these signals may correct phase errors in these signals. Different signals, however, may have a relative phase error that results from delay in the different signal paths or component mismatches in these signal paths. Due to these relative phase errors, adjusting the phase of one signal may introduce phase errors in other signals.

This disclosure describes a phase adjustor that shifts the phases of two signals by the same amount but in different directions. For example, the phase adjustor may add an offset to the phase of a first signal and subtract the offset from the phase of a second signal. In this manner, phase error (including relative phase error) for these two signals may be corrected by adjusting the phases of both signals, rather than adjusting the phase of only one of the signals.

Figure 1:
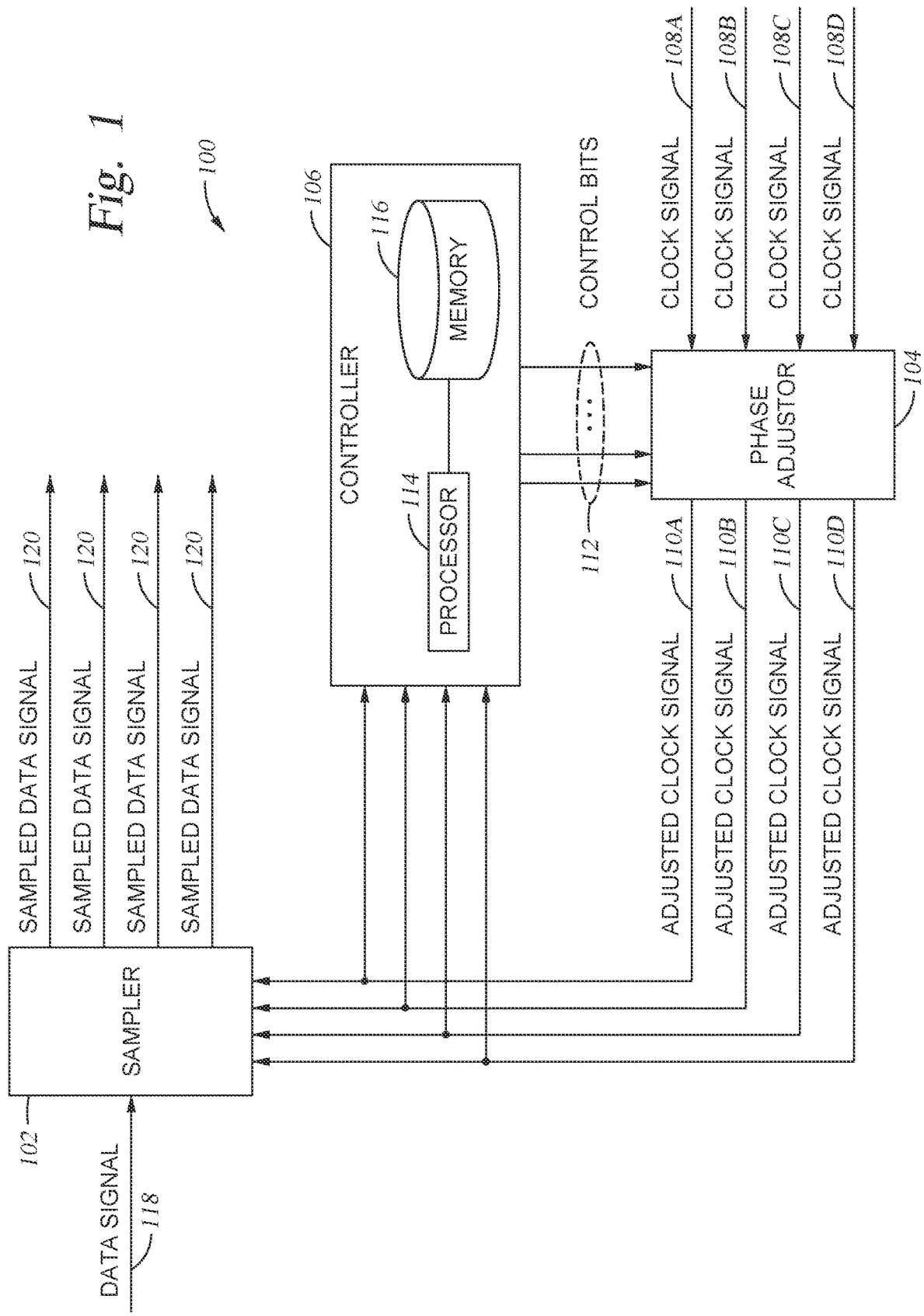
FIG. 1 illustrates an example system.

FIG. 1 illustrates an example system 100. As seen in FIG. 1, the system 100 includes a sampler 102, a phase adjustor 104, and a controller 106. Generally, the sampler 102 samples a data signal according to one or more clock signals provided to the sampler 102. The phase adjustor 104 and the controller 106 work together to adjust one or more clock signals to correct phase errors for those clock signals. In particular embodiments, the phase adjustor 104 and/or the controller 106 correct relative phase errors for clock signals by adjusting the phases of the clock signals by the same amount, but in different directions. The phase adjustor 104 provides the adjusted clock signals to the sampler 102.

The sampler 102 samples a data signal 118 to produce one or more sampled data signals 120. The sampler 102 samples the data signal 118 according to one or more received clock signals. For example, the sampler 102 may sample the data signal 118 on edges (e.g., rising or falling edges) of a received clock signal to produce a sampled data signal 120. The sampler 102 may produce a sampled data signal 120 for each received clock signal. If the received clock signals have different phases, then the sampled data signals 120 may be staggered in time based on the phase differences between or amongst the received clock signals. The sampled data signals 120 may then be combined to produce a representation of the data signal 118. For example, the sampled data signals 120 may be combined to produce a digital representation of the data signal 118. The sampler 102 may sample the data signal 118 according to any number of clock signals to produce any number of sampled data signals 120.

The phase differences between or amongst the received clock signals may be controlled or coordinated, such that the sampler 102 samples the data signal 118 at particular points in time. For example, the received clock signals may be controlled or coordinated, such that the received clock signals are 90 degrees out of phase. The sampler 102 then samples the data signal 118 during the rising or falling edges of the received clock signals. Due to the controlled phase differences between or amongst the received clock signals, the sampler 102 samples the data signal 118 at particular points in time to produce the sample data signals 120.

Due to delays in the signal path or component mismatches in the clock generation circuitry, the received clock signals may include phase errors. Additionally, the received clock signals may have relative phase errors that affect the sampling of the data signal 118. These phase errors, if uncorrected, may cause the sampler 102 to sample the data signal 118 at less than optimal times, which may result in the sampled data signals 120 having less signal strength or signal quality.

The phase adjustor 104 and the controller 106 operate together to adjust the phases of received clock signals 108. The phase adjustor 104 produces one or more adjusted clock signals 110 that are then communicated to the sampler 102. The sampler 102 then samples the data signal 118 according to the adjusted clock signals 110. The phase adjustor 104 and the controller 106 may adjust the phases of the one or more clock signals 108 to correct phase errors for the clock signals 108. In this manner, the adjusted clock signals 110 have corrected phases so that the sampler 102 samples the data signal 118 at the appropriate times, in particular embodiments.

The phase adjustor 104 receives one or more clock signals 108. In the example of FIG. 1, the phase adjustor 104 receives clock signals 108A, 108B, 108C, and 108D. The clock signals 108 may have been generated by a clock generation circuit. The phase adjustor 104 adjusts the phases of one or more of the clock signals 108 to produce the adjusted clock signals 110. Generally, the phase adjustor 104 adjusts the phases of the clock signals 108 in pairs. The phase adjustor 104 may add an offset to the phase of a clock signal 108 while subtracting the offset from the phase of another clock signal 108. As a result, the phase adjustor 104 shifts the phases of the two clock signals 108 by the same amount in different directions. In this manner, the phase adjustor 104 may adjust the phases of the clock signals 108 while accounting for relative phase error between the two clock signals 108.

The controller 106 receives the adjusted clock signals 110 and detects phase errors and relative phase errors in the adjusted clock signals 110. The controller 106 then determines one or more offsets to be added to or subtracted from the phases of one or more clock signals 108. The controller 106 then generates control bits 112 that are communicated to the phase adjustor 104. The phase adjustor 104 then interprets the control bits 112 to adjust the phases of one or more clock signals 108 using the offset determined by the controller 106. For example, the controller 106 may determine that the clock signals 108A and 108C should be 180 degrees out of phase with one another and that the clock signals 108B and 108D should be 180 degrees out of phase with one another. The controller 106 analyzes the clock signals 108B and 108D to determine that they are 178 degrees out of phase with one another. The controller 106 then adjusts the control bits 112 so that the phase adjustor 104 shifts the phases of the clock signals 108B and 108D by the same amount in different directions. For example, the phase adjustor 104 may add an offset (e.g., 1 degree) to the phase of the clock signal 108B and subtract the offset from the phase of the clock signal 108D. In this manner, the controller 106 brings the clock signals 108B and 108D closer to being 180 degrees out of phase with one another. As seen in FIG. 1, the controller 106 includes a processor 114 and a memory 116, which are configured to perform any of the functions of the controller 106 described herein.

The processor 114 is any electronic circuitry, including, but not limited to one or a combination of microprocessors, microcontrollers, application specific integrated circuits (ASIC), application specific instruction set processor (ASIP), and/or state machines, that communicatively couples to memory 116 and controls the operation of the controller 106. The processor 114 may be 8-bit, 16-bit, 32-bit, 64-bit or of any other suitable architecture. The processor 114 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor 114 may include other hardware that operates software to control and process information. The processor 114 executes software stored on the memory 116 to perform any of the functions described herein. The processor 114 controls the operation and administration of the controller 106 by processing information (e.g., information received from the phase adjustor 104 and the memory 116). The processor 114 is not limited to a single processing device and may encompass multiple processing devices.

The memory 116 may store, either permanently or temporarily, data, operational software, or other information for the processor 114. The memory 116 may include any one or a combination of volatile or non-volatile local or remote devices suitable for storing information. For example, the memory 116 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 116, a disk, a CD, or a flash drive. In particular embodiments, the software may include an application executable by the processor 114 to perform one or more of the functions described herein.

Figure 2:
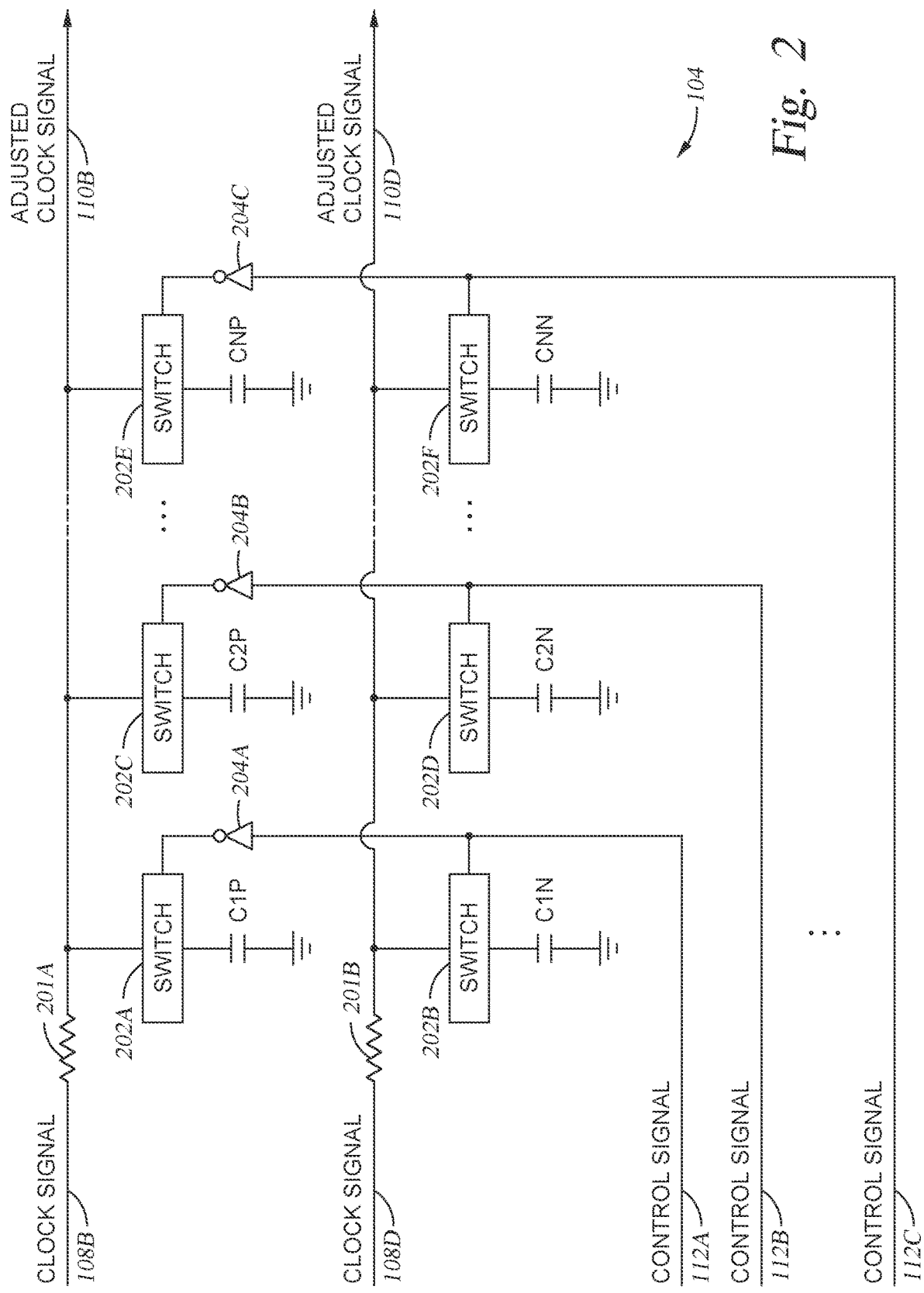
FIG. 2 illustrates an example phase adjustor of the system of FIG. 1.

FIG. 2 illustrates an example phase adjustor 104 in the system 100 of FIG. 1.

Figure 4:
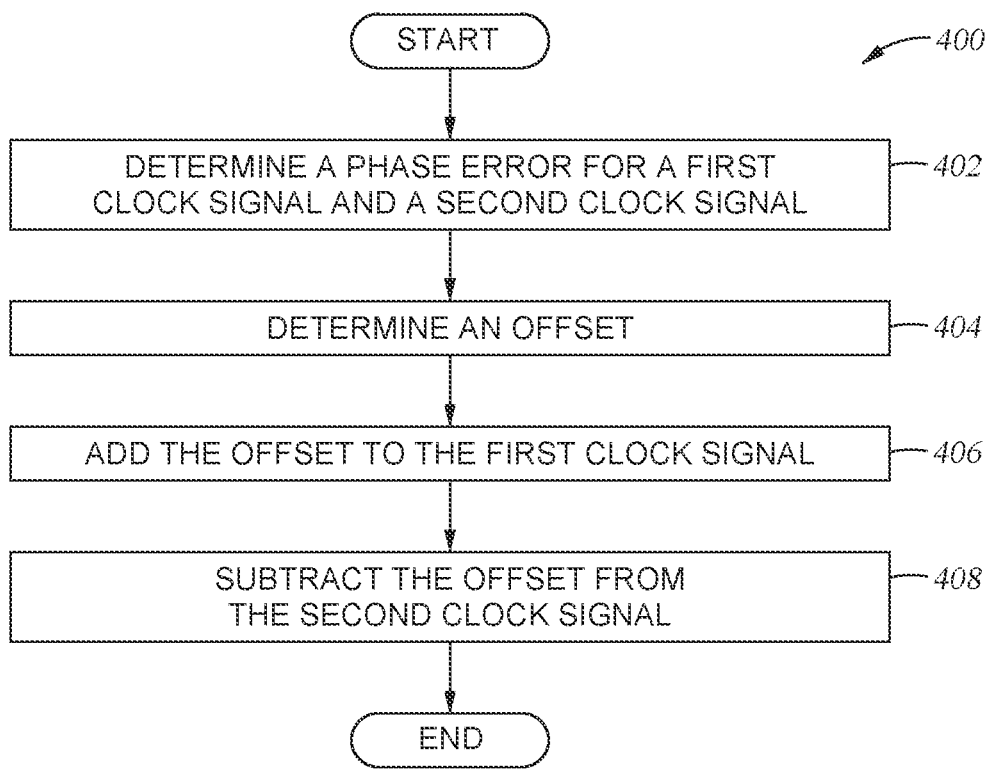
FIG. 4 is a flowchart of an example method in the system of FIG. 1.

As seen in FIG. 4, the phase adjustor 104 includes resistors 201A and 201B, a plurality of switches 202, a plurality of inverters 204, and a plurality of capacitors C1P, C1N, C2P, C2N, CNP, CNN. These components operate according to one or more control bits 112 to adjust the phases of one or more clock signals 108 to produce one or more adjusted clock signals 110. In particular embodiments, the phase adjustor 104 adjusts the phases of two clock signals 108 relative to each other to correct phase errors for the clock signals 108. In some embodiments, the phase adjustor 104 includes additional components (e.g., transistors, switches, current sources, etc.) that are not illustrated in FIG. 2 to implement an inverter-based programmable delay line or current-mode logic (CIVIL)-based delay structure.

Generally, the switches 202 couple one or more of the capacitors to a resistor 201A or 201B to introduce RC delay to a corresponding clock signal 108, which adjusts the phase of the clock signal 108 to produce an adjusted clock signal 110. In the example of FIG. 2, the phase adjustor 104 adjusts the phases of clock signals 108B and 108D relative to each other to produce the adjusted clock signals 110B and 110D. The phase adjustor 104 may adjust the phases of any number of clock signals 108.

As seen in FIG. 2, each of the switches 202 is connected to a capacitor to form an adjustor. Each switch 202 can open or close to disconnect or connect its corresponding capacitor to a resistor 201A or 201B, which adjusts an RC delay introduced into a corresponding clock signal 108 to produce an adjusted clock signal 110. Additionally, each switch 202 is paired with another switch 202 that is connected to another capacitor and that can open or close to produce the other adjusted clock signal 110. As seen in FIG. 2, the switches 202A, 202C, and 202E can open or close to disconnect or connect their corresponding capacitors to the resistor 201A to adjust the RC delay introduced into the clock signal 108B to produce the adjusted clock signal 110B. The switches 202B, 202D, and 202F can open or close to disconnect or connect their corresponding capacitors to the resistor 201B to adjust the RC delay introduced into the clock signal 108D to produce the adjusted clock signal 110D. The switch 202A is paired with the switch 202B. The switch 202C is paired with the switch 202D. The switch 202E is paired with the switch 202F. The phase adjustor 104 may include any suitable number of switches 202 and capacitors.

Each pair of switches 202 is controlled by a control bit 112. One switch 202 in the pair is connected with an inverter 204 to invert the control bit 112. As a result, when one switch 202 in the pair is opened, the other switch 202 in the pair is closed. In the example of FIG. 2, the switches 202A and 202B are controlled by the control bit 112A. An inverter 204A inverts the control bit 112A for the switch 202A. The switches 202C and 202D are controlled by the control bit 112B. An inverter 204B inverts the control bit 112B for the switch 202C. The switches 202E and 202F are controlled by the control bit 112C. An inverter 204C inverts the control bit 112C for the switch 202E.

Each switch 202 is connected to a capacitor. When a switch 202 is closed, the switch 202 connects the capacitor to a resistor 201A or 201B to adjust the RC delay introduced to a clock signal 108 to produce the corresponding adjusted clock signal 110. In the example of FIG. 2, the switch 202A is connected to a capacitor C1P. The switch 202B is connected with a capacitor C1N. The switch 202C is connected with a capacitor C2P. The switch 202D is connected with a capacitor C2N. The switch 202E is connected with a capacitor CNP. The switch 202F is connected with a capacitor CNN. The phase adjustor 104 may include any suitable number of switches 202 and capacitors. When the switch 202 is open, the switch 202 disconnects its corresponding capacitor from the corresponding resistor 201A or 201B and adjusted clock signal 110. Each pair of switches 202 and their corresponding capacitors may be connected or disconnected from their corresponding resistors 201A and 201B and adjusted clock signals 110 to adjust the phases of the clock signals 108 by a step size. The step size may depend on the size of the capacitors.

Using the control bits 112, a number of capacitors may be connected to or disconnected from the resistors 201A and 201B to adjust the phases of the clock signals 108 by a certain number of steps. For example, the controller 106 may analyze the adjusted clock signals 110 to determine a phase error for the adjusted clock signals 110. The controller 106 may then determine an offset that should be used to adjust the phases of the adjusted clock signals 110 to correct the phase error. The controller 106 then sets the control bits 112 for the phase adjustor 104 so that a certain number of capacitors are connected to or disconnected from the resistors 201A and 201B. The phase adjustor 104 then connects or disconnects the capacitors from the resistors 201A and 201B based on the control bits 112 to adjust the RC delay introduced into the phases of the clock signals 108. As discussed previously, because a pair of switches 202 and their corresponding capacitors are controlled to operate opposite each other, when a capacitor in a pair is connected to a resistor 201A or 201B, the other capacitor in the pair is disconnected from the resistor 201B or 201A. For example, as seen in FIG. 2, when the switch 202A is closed to connect the capacitor C1P to the resistor 201A, the switch 202B is opened to disconnect the capacitor C1N from the resistor 201B. As a result, the phases of both clock signals 108B and 108D are adjusted by one step in opposite directions. In this manner, when a certain number of steps are added to the phase of the clock signal 108B, the same number of steps are subtracted from the phase of the clock signal 108D. As a result, the phase adjustor 104 increases the time delay of a clock signal 108 while decreasing the time delay of the other clock signal 108 by the same amount. Thus, the phases of the clock signals 108 are adjusted relative to each other, which may correct relative phase error for the clock signals 108.

In particular embodiments, the controller 106 may determine the offset for the phase adjustor 104 iteratively. For example, the controller 106 may determine, based on the adjusted clock signals 110, that there is a phase error for the clock signals 108B and 108D. In response, the controller 106 may set a control bit 112A to adjust the phases of the clock signals 108B and 108D by one step. After adjusting the phases by one step, the controller 106 analyzes the adjusted clock signals 110B and 110D to determine whether there still is a phase error greater than the step size of the phase adjustor 104. If there is still a phase error that exceeds the step size, the controller 106 sets the control bit 112B to further adjust the phases by another step. This process continues until the phase error is reduced below the step size of the phase adjustor 104. In this manner, the controller 106 and the phase adjustor 104 iteratively adjust the phases for the clock signals 108 to correct the phase error.

In some embodiments, the controller 106 determines the offset using a binary search process. For example, the controller 106 may analyze the adjusted clock signals 110 to determine that there is a phase error for the clock signals 108B and 108D. The controller 106 then sets a number of control bits 112 to add an offset to the phase of the clock signal 108B and to subtract the offset from the phase of the clock signal 108D. The controller 106 then analyzes the adjusted clock signals 110B and 110D to determine that there still is a phase error. The controller 106 then determines a second offset to be subtracted from the phase of the clock signal 108B and to be added to the phase of the clock signal 108D. The second offset may be smaller than the initial offset. The controller 106 then sets the control bits 112 to subtract the second offset from the phase of the clock signal 108B and to add the second offset to the phase of the clock signal 108D. The controller 106 and the phase adjustor 104 may continue this process of adjusting the phases of the clock signals 108B and 108D using smaller offsets until the phase error for the adjusted clock signals 110B and 110D is below a step size of the phase adjustor 104. In this manner, the controller 106 and the phase adjustor 104 may correct the phase error more quickly than if the offset had been determined incrementally.

As discussed previously, the phase adjustor 104 may adjust the phases of any number of clock signals 108. The phase adjustor may include a set of switches 202 and capacitors for any pair of clock signals 110. Thus, the example shown in FIG. 2 represents only a portion of the switches 202 and capacitors in the phase adjustor 104.

This disclosure contemplates the phase adjustor 104 adjusting the phase of clock signals using any suitable circuit or mechanism. In other words, the phase adjustor 104 is not limited to the resistors 201, switches 202, and capacitors as arranged in the example of FIG. 2 to introduce RC delay into the clock signals. For example, the phase adjustor 104 may be implemented as an inverter-based programmable delay line or current-mode logic (CIVIL)-based delay structure. The phase adjustor 104 may include additional transistors and/or switches and a current source connected to the resistors that can further adjust the phase of the clock signals. By controlling the parameters of the transistors and/or switches, delay can be introduced into the clock signals.

Figure 3A:
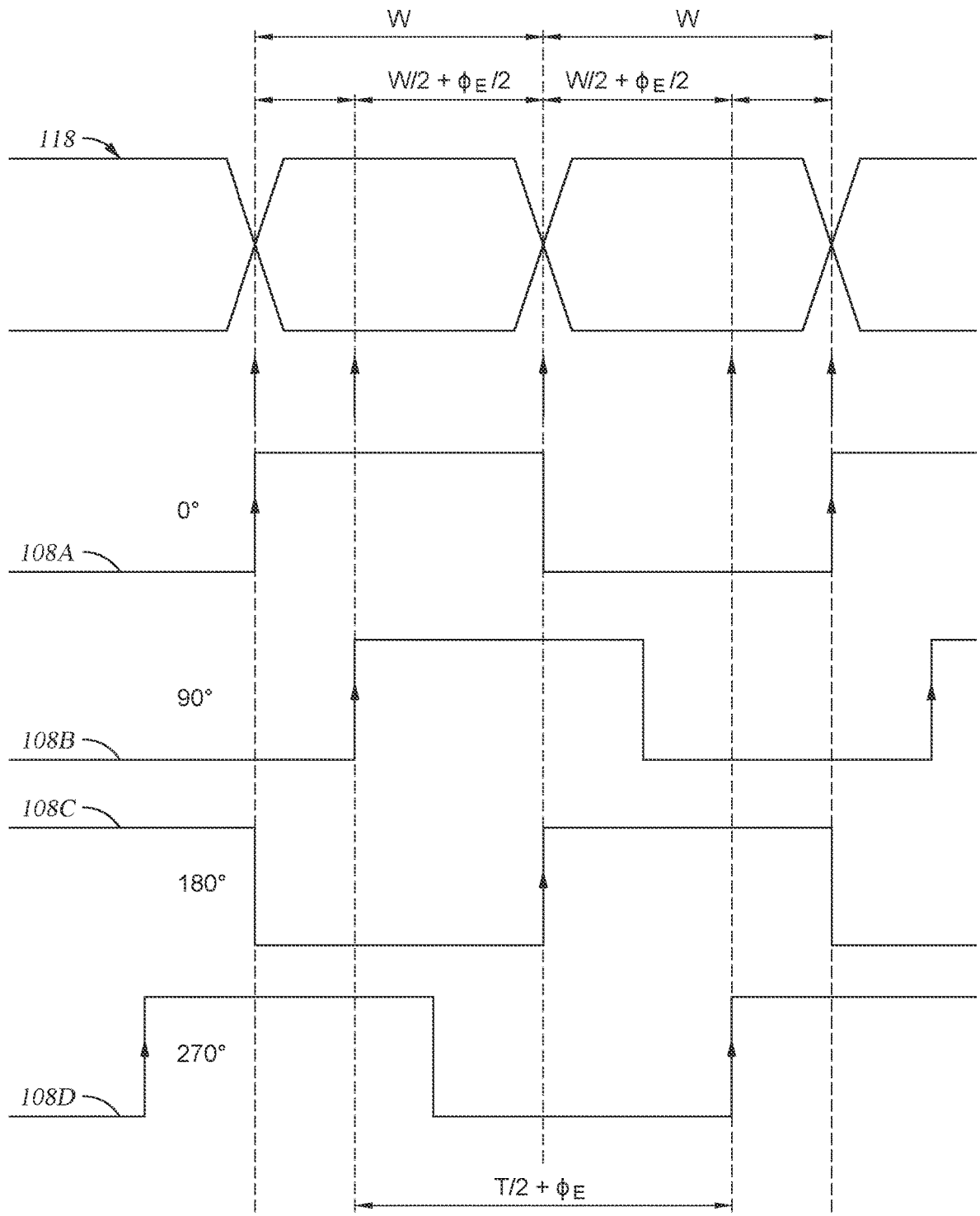
FIGS. 3A and 3B illustrate an example phase adjustment using the system of FIG. 1.
Figure 3B:
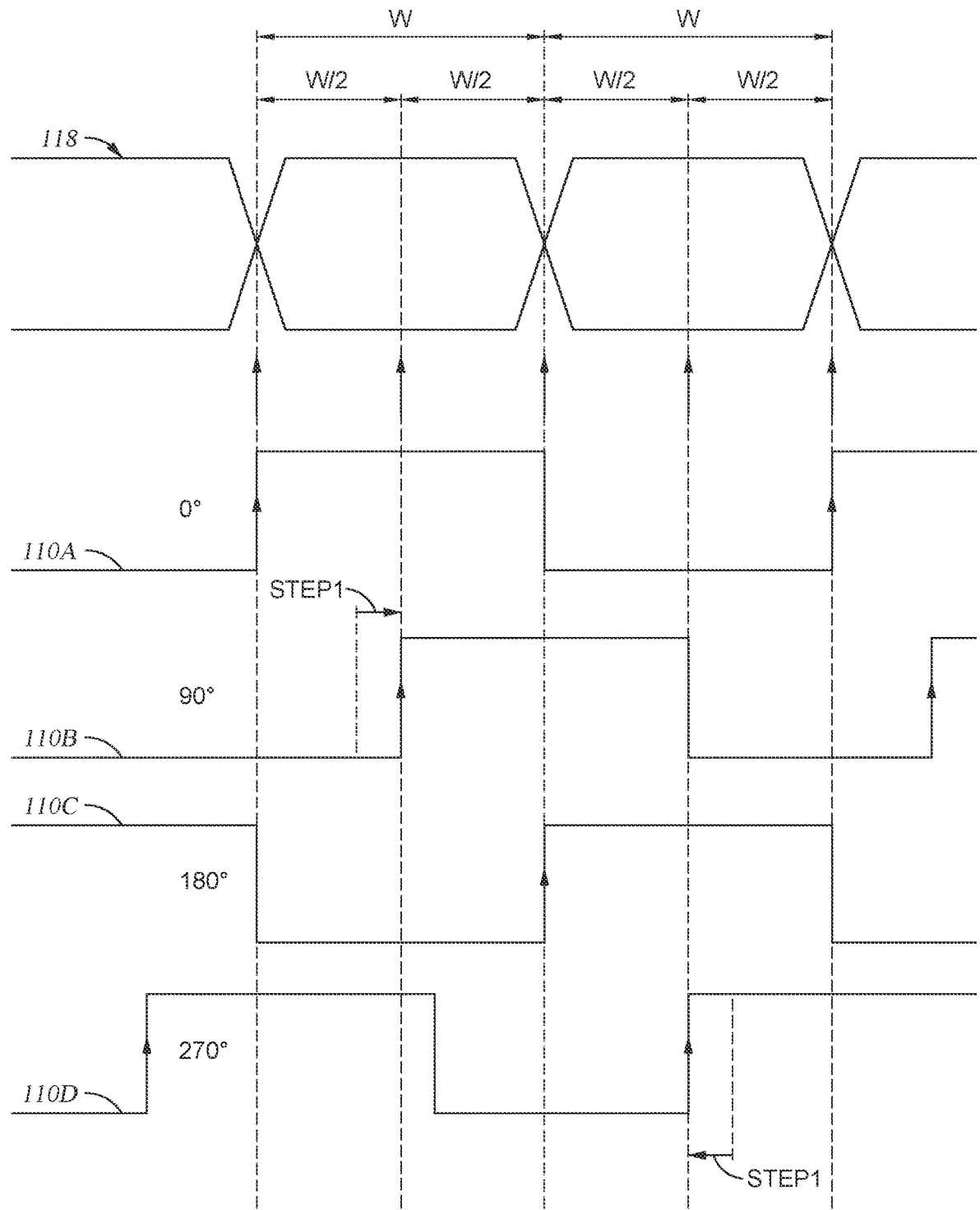

FIGS. 3A and 3B illustrate an example phase adjustment using the system 100 of FIG. 1. As seen in FIG. 3A, a data signal 118 is sampled according to the clock signals 108A, 108B, 108C, and 108D. As discussed previously, the data signal 118 may be sampled according to any number of clock signals 108. The clock signal 108B (90 degree phase) is 90 degrees out of phase with the clock signal 108A (0 degree phase). The clock signal 108C (180 degree phase) is 90 degrees out of phase with the clock signal 108B. The clock signal 108D (270 degree phase) is 90 degrees out of phase with the clock signal 108C. The clock signal 108A is 90 degrees out of phase with the clock signal 108D. The data signal 118 is sampled on the rising edges of the clock signals 108A, 108B, 108C, and 108D, respectively. 108A and 108C are used to sample the edge of the data signal 118, while 108B and 108D are used to sample the data content of the data signal 118. Ideally, the data signal 118 should be sampled by 108B and 108D rising edges at the midpoint of a data block. As seen in FIG. 3A, each data block has a width W, so the ideal sampling location is at a point W/2. It is intended that the rising edges of the clock signals 108B and 108D are positioned at the midpoint of a data block. However, because there is a phase error $\phi_E$ for the clock signals 108B and 108D, the rising edges of the clock signals 108B and 108D are positioned off the midpoint of the data blocks by $\phi_E/2$. T indicates the cycle time of clock 108. If this phase error is not corrected, then the data signal 118 is sampled closer to the edges of the data block, which may reduce the signal quality or strength of the sampled data signal.

FIG. 3B shows the correction made by the phase adjustor 104 and the controller 106. As seen in FIG. 3B, an offset (e.g., $\phi_E/2$) is added to the phase of the clock signal 110B, and the same offset is subtracted from the phase of the clock signal 110D. As a result, the rising edge of the clock signal 110B is shifted later in time such that the rising edge falls on the midpoint of the data block. Additionally, the rising edge of the clock signal 110D is shifted such that the rising edge of the clock signal 110D is on the midpoint of a data block. By making these adjustments to the clock signals 110B and 110E, the data signal 118 may be sampled at the midpoints of the data blocks, which improves the signal strength and quality of the sampled data signal 120.

The offset that is added to the phase of the clock signal 110B and subtracted from the phase of the clock signal 110D may be determined by the controller 106. For example, the controller 106 may calculate a difference between the edge of a data block and the rising edge of a clock signal (e.g., the clock signal 110B). The controller 106 then compares this difference with the width of the data block to determine the phase error. In the examples of FIGS. 3A and 3B, the controller 106 may determine that the phase error is $\phi_E$, and that the offset should be $\phi_E/2$. The controller 106 may then set one or more control bits 112 to toggle a number of switches 202 to connect or disconnect a certain number of capacitors from the clock signals 110B and 110D. As a result, the phase adjustor 104 adds the offset to the phase of the clock signal 110B and subtracts the offset from the phase of the clock signal 110D.

In some embodiments, the controller 106 determines the offset incrementally. The controller 106 continues incrementing the phase of the clock signal 110B and decrementing the phase of the clock signal 110D by a step size of the phase adjustor 104 until the rising edges of the clock signals 110B and 110D are within a step size of the midpoint of a data block. In certain embodiments, the controller 106 adjusts the phases of the clock signals 110B and 110D using a binary search process to bring the rising edges of the clock signals 110B and 110D closer to the midpoint of the data blocks. The controller 106 may add and subtract decreasing offsets to the phases of the clock signals 110B and 110D until the rising edges are within a step size of the midpoint of the data block.

FIG. 4 is a flowchart of an example method 400 in the system 100 of FIG. 1. The controller 106 and/or the phase adjustor 104 may perform the method 400. In particular embodiments, by performing the method 400, the phase adjustor 104 adjusts the phases of two clock signals 108 relative to each other.

In block 402, the controller 106 and/or the phase adjustor 104 determine a phase error for a first clock signal 108 and a second clock signal 108. The controller 106 may determine the phase error by analyzing the adjusted clock signals 110 produced by the phase adjustor 104 based on these clock signals 108. For example, the phase adjustor 104 and/or the controller 106 may determine that the first clock signal 108 and the second clock signal 108 should be 180 degrees out of phase with one another. However, the controller 106 may determine that the adjusted clock signals 110 produced by the phase adjustor 104 based on these clock signals 108 are not 180 degrees out of phase with one another. The controller 106 may then calculate the phase error based on how much the adjusted clock signals 110 are out of phase with one another.

In block 404, the controller 106 determines an offset based on the phase error. For example, the controller 106 may determine that the offset is the phase error divided by two. In block 406, the phase adjustor 104 and/or the controller 106 adds the offset to the first clock signal 108. In some embodiments, the controller 106 sets one or more control bits 112 to toggle one or more switches 202 in the phase adjustor 104 to connect or disconnect certain capacitors from the first clock signal 110. As a result of connecting and disconnecting these capacitors, the offset is added to the phase of the first clock signal 108. In block 408, the phase adjustor 104 and/or the controller 106 subtract the offset from the second clock signal 108. For example, the controller 106 may set one or more control bits 112 to toggle one or more switches 202 in the phase adjustor 104. These switches 202 may be paired with the switches that were toggled for the first clock signal 108 in block 406. By toggling the switches, the phase adjustor 104 connects or disconnects certain capacitors from the second clock signal 110, which results in the offset being subtracted from the phase of the second clock signal 108. As a result, the phases of the first clock signal 108 and the second clock signal 108 are adjusted by the same offset but in different directions. In this manner, the phases of the first clock signal 108 and the second clock signal 108 are adjusted relative to each other.

Figure 5:
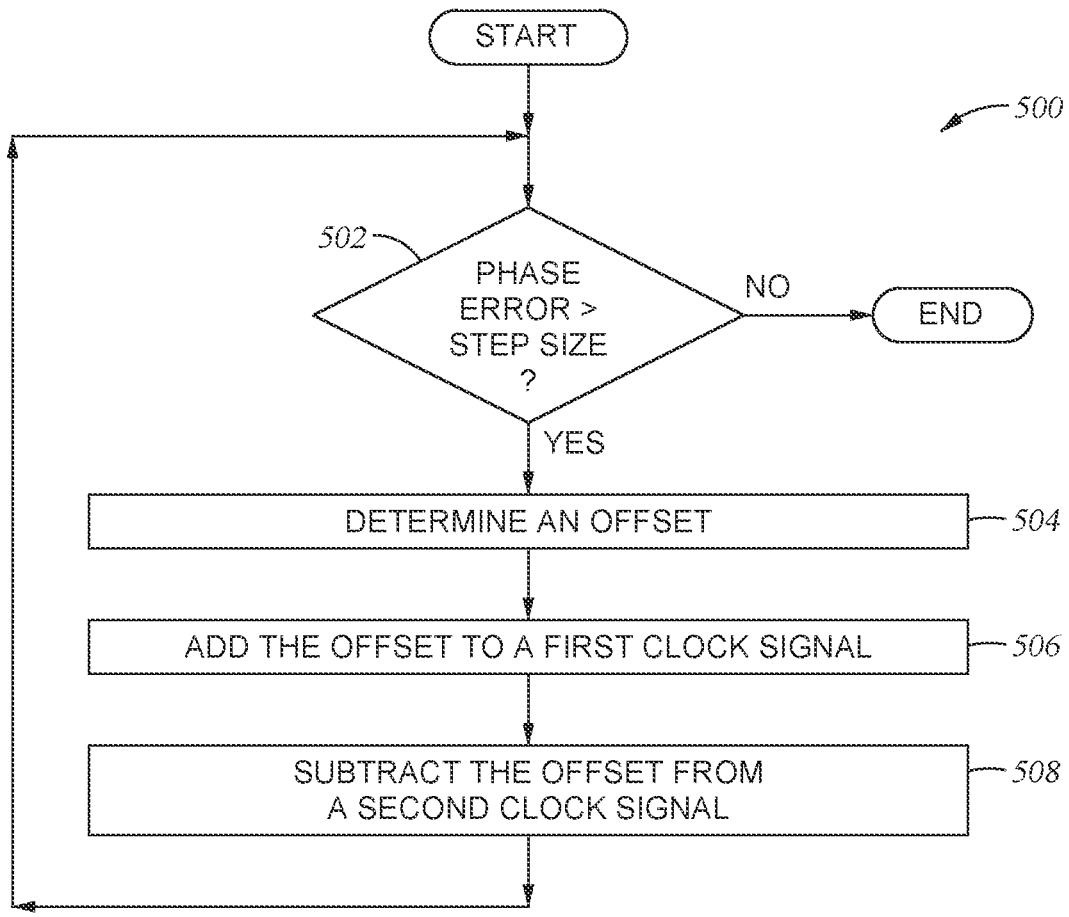
FIG. 5 is a flowchart of an example method in the system of FIG. 1.

FIG. 5 is a flowchart of an example method 500 in the system 100 of FIG. 1. The phase adjustor 104 and/or the controller 106 may perform the method 500. In particular embodiments, by performing the method 500, the phase of a clock signal 108 is incrementally adjusted. The method 500 may be performed after the method 400.

In block 502, the controller 106 determines whether the phase error for a first clock signal 108 and a second clock signal 108 exceeds a step size of the phase adjustor 104. The step size may be based on the size of the capacitors within the phase adjustor 104. If the phase error 502 for the clock signals 108 exceeds the step size, then the controller 106 and/or the phase adjustor 104 may determine an offset in block 504. The offset may be the step size.

In block 506, the phase adjustor 104 and/or the controller 106 add the offset to the first clock signal 108. In block 508, the phase adjustor 104 and/or the controller 106 subtract the offset from the second clock signal 108. If the offset is a step size, then the controller 106 and/or the phase adjustor 104 incremented the phase of the first clock signal 108 by the step size and decremented the phase of the second clock signal 108 by the step size. The controller 106 and/or the phase adjustor 104 may increment or decrement the phase by setting a control bit 112 to toggle a pair of switches 202 in the phase adjustor 104.

The phase adjustor 104 and/or the controller 106 then return to block 502 to determine if the phase error for the clock signals 108 still exceeds the step size. If the phase error still exceeds the step size, then the phase adjustor 104 and/or the controller 106 may perform blocks 504, 506 and 508 again. If the phase error no longer exceeds the step size, then the phase adjustor 104 and/or the controller 106 may end the method 500.

Figure 6:
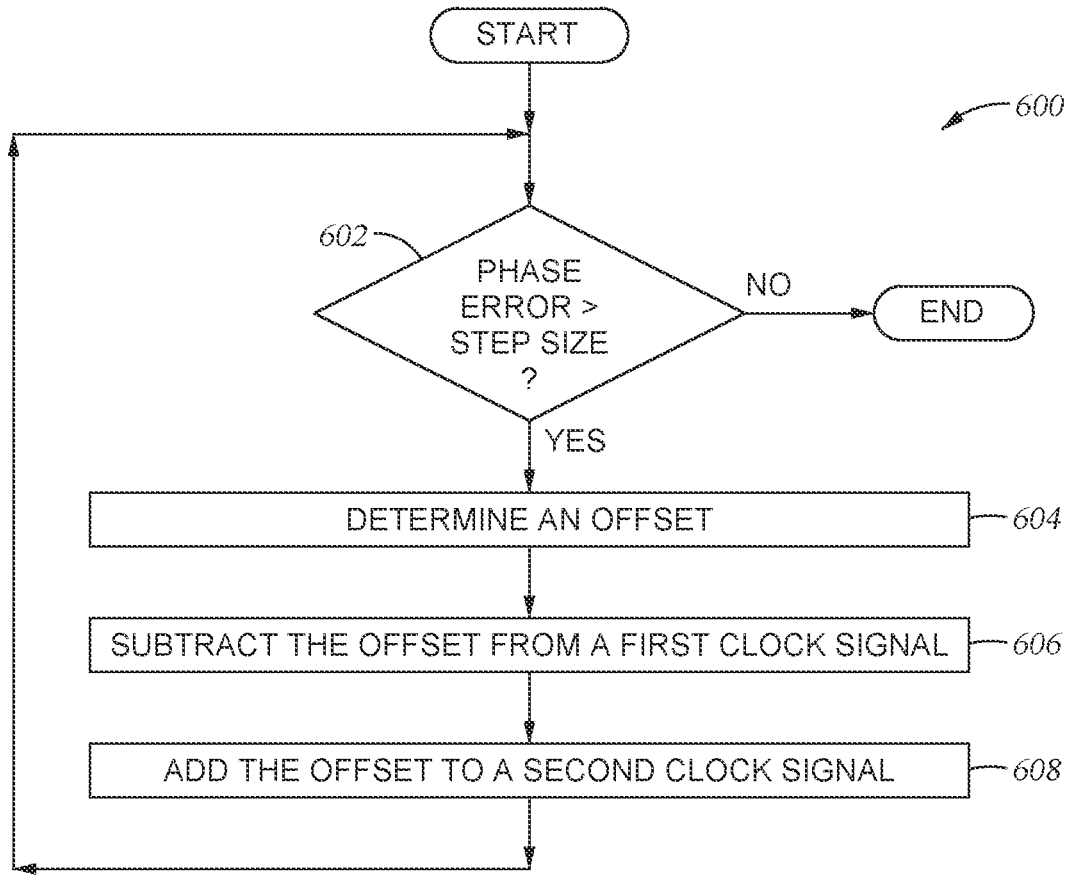
FIG. 6 is a flowchart of an example method in the system of FIG. 1.

FIG. 6 is a flowchart of an example method 600 in the system 100 of FIG. 1. The phase adjustor 104 and/or the controller 106 may perform the method 600. In particular embodiments, by performing the method 600, the phase adjustor 104 and/or the controller 106 determine an offset using a binary search process. The method 600 may be performed after the method 400.

In block 602, the phase adjustor 104 and/or the controller 106 determine whether a phase error for clock signals 108 exceeds a step size of the phase adjustor 104. If the phase error exceeds the step size, then the phase adjustor 104 and/or the controller 106 determine an offset in block 604. The offset determined in block 604 may be smaller than the offset determined in block 404. In block 606, the phase adjustor 104 and/or the controller 106 subtract the offset from the phase of a first clock signal 108. In block 608, the phase adjustor 104 and/or the controller 106 add the offset to the phase of a second clock signal 108. In this manner, the phase adjustor 104 and/or the controller 106 shift the phases of the first and second clock signals 108 in a direction opposite to the direction the phases were shifted in the method 400. However, because the offset determined in block 604 is smaller than the offset determined in the method 400, the phases of the first and second clock signals 108 are adjusted less than they were adjusted in the method 400.

The phase adjustor 104 and the controller 106 may then move back to block 602 to determine if the phase error for the clock signals 108 still exceeds the step size. If the phase error still exceeds the step size, the phase adjustor 104 and the controller 106 perform block 604, 606 and 608 again. If the phase error does not exceed the step size, then the phase adjustor 104 and/or the controller 106 end the method 600.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method comprising:
   determining a phase error for a first clock signal and a second clock signal;
   determining an offset based on the phase error for the first clock signal and the second clock signal;
   adjusting a control bit to connect a capacitor to the first clock signal to add the offset to a phase of the first clock signal to produce a first adjusted clock signal; and
   subtracting the offset from a phase of the second clock signal to produce a second adjusted clock signal, wherein a phase error for the first adjusted clock signal and the second adjusted clock signal is smaller than the phase error for the first clock signal and the second clock signal.

2. The method of claim 1, further comprising sampling a data signal using the first adjusted clock signal and the second adjusted clock signal.

3. The method of claim 2, wherein determining the offset comprises determining a difference between an edge of the first clock signal and an edge of the data signal.

4. The method of claim 1, further comprising:
   determining a second offset based on the phase error for the first adjusted clock signal and the second adjusted clock signal;
   adding the second offset to a phase of the first adjusted clock signal; and
   subtracting the second offset from a phase of the second adjusted clock signal.

5. The method of claim 4, wherein:
   the second offset is determined in response to determining that the phase error for the first adjusted clock signal and the second adjusted clock signal exceeds a step size; and
   adding the second offset to the phase of the first adjusted clock signal and subtracting the second offset from the phase of the second adjusted clock signal reduces the phase error for the first adjusted clock signal and the second adjusted clock signal by the step size.

6. The method of claim 1, further comprising:
   determining a second offset based on the phase error for the first adjusted clock signal and the second adjusted clock signal;

subtracting the second offset from a phase of the first adjusted clock signal; and adding the second offset to a phase of the second adjusted clock signal.

7. A phase adjustor comprising:
a first adjustor;
a second adjustor; and
a control line connected to the first adjustor and the second adjustor, wherein the first adjustor is configured to produce a first adjusted clock signal by:
adding an offset to a phase of a first clock signal when a control signal on the control line is high; and
subtracting the offset from the phase of the first clock signal when the control signal is low; and
wherein the second adjustor is configured to produce a second adjusted clock signal by:
subtracting the offset from a phase of a second clock signal when the control signal is high; and
adding the offset to the phase of the second clock signal when the control signal is low, wherein the offset is determined based on a phase error for the first clock signal and the second clock signal.

8. The phase adjustor of claim 7, wherein:
the first adjustor comprises a first capacitor connected to a first switch;
the second adjustor comprises a second capacitor connected to a second switch; and
the control signal controls both the first switch and the second switch.

9. The phase adjustor of claim 8, wherein adding the offset to the phase of the first clock signal comprises toggling the first switch such that the first capacitor is connected to the first clock signal.

10. The phase adjustor of claim 7, wherein a data signal is sampled using the first adjusted clock signal and the second adjusted clock signal.

11. The phase adjustor of claim 10, wherein the offset is determined by determining a difference between an edge of the first clock signal and an edge of the data signal.

12. The phase adjustor of claim 7, further comprising:
a third adjustor; and
a second control line, wherein the third adjustor is configured to:
add a second offset to a phase of the first adjusted clock signal when a second control signal on the second control line is high; and
subtract the second offset from a phase of the first adjusted clock signal when the second control signal is low, wherein the second offset is determined based on a phase error for the first adjusted clock signal and the second adjusted clock signal.

13. The phase adjustor of claim 12, wherein:
the second offset is determined in response to determining that the phase error for the first adjusted clock signal and the second adjusted clock signal exceeds a step size; and
the third adjustor is further configured to reduce the phase error for the first adjusted clock signal and the second adjusted clock signal by the step size.

14. A method comprising:
determining an offset based on a phase error for a first clock signal and a second clock signal;
toggling a first switch such that the offset is added to a phase of the first clock signal to produce a first adjusted clock signal; and
toggling a second switch such that the offset is subtracted from a phase of the second clock signal to produce a second adjusted clock signal, wherein a phase error for the first adjusted clock signal and the second adjusted clock signal is smaller than the phase error for the first clock signal and the second clock signal.

15. The method of claim 14, further comprising sampling a data signal using the first adjusted clock signal and the second adjusted clock signal.

16. The method of claim 15, wherein determining the offset comprises determining a difference between an edge of the first clock signal and an edge of the data signal.

17. The method of claim 14, further comprising:
determining a second offset based on the phase error for the first adjusted clock signal and the second adjusted clock signal;
toggling a third switch such that the second offset is added to a phase of the first adjusted clock signal; and
toggling a fourth switch such that the second offset is subtracted from a phase of the second adjusted clock signal.

18. The method of claim 17, wherein:
the second offset is determined in response to determining that the phase error for the first adjusted clock signal and the second adjusted clock signal exceeds a step size; and
adding the second offset to the phase of the first adjusted clock signal and subtracting the second offset from the phase of the second adjusted clock signal reduces the phase error for the first adjusted clock signal and the second adjusted clock signal by the step size.

19. The method of claim 14, wherein the first switch is connected to a first capacitor and the second switch is connected to a second capacitor.

* * * * *